United States Patent
Hsu

(10) Patent No.: US 8,240,881 B2
(45) Date of Patent: Aug. 14, 2012

(54) LIGHT-EMITING DEVICE PACKAGE

(75) Inventor: Chia-Liang Hsu, Hsinchu (TW)

(73) Assignee: Epistar Corporation (TW)

( * ) Notice: Subject to any disclaimer, the term of this patent is extended or adjusted under 35 U.S.C. 154(b) by 660 days.

(21) Appl. No.: 12/292,161

(22) Filed: Nov. 13, 2008

(65) Prior Publication Data

US 2009/0122521 A1    May 14, 2009

(30) Foreign Application Priority Data

Nov. 13, 2007  (TW) ................................ 96143129 A

(51) Int. Cl.
*F21V 7/04* (2006.01)
*H01J 1/62* (2006.01)

(52) U.S. Cl. .................. 362/249.02; 362/612; 362/613; 362/800

(58) Field of Classification Search .................. None
See application file for complete search history.

(56) References Cited

U.S. PATENT DOCUMENTS

| | | | | |
|---|---|---|---|---|
| 6,735,373 B2 * | 5/2004 | Umemoto | ...................... | 385/146 |
| 7,040,767 B2 * | 5/2006 | Lee et al. | ......................... | 353/99 |
| 7,073,933 B2 * | 7/2006 | Gotoh et al. | ................... | 362/624 |
| 7,520,642 B2 * | 4/2009 | Holman et al. | ................ | 362/328 |
| 7,722,220 B2 * | 5/2010 | Van De Ven | .................. | 362/294 |
| 7,738,053 B2 * | 6/2010 | Kubota | ............................ | 349/65 |
| 2002/0117676 A1 | 8/2002 | Katoh | | |
| 2004/0135504 A1 * | 7/2004 | Tamaki et al. | ................. | 313/512 |
| 2007/0086209 A1 | 4/2007 | Hwang et al. | | |

FOREIGN PATENT DOCUMENTS

| | | |
|---|---|---|
| JP | 2006-056595 | 3/2006 |
| TW | 200539481 | 12/2005 |
| TW | 200620694 | 6/2006 |
| TW | 200635074 | 10/2006 |

* cited by examiner

*Primary Examiner* — Anabel Ton
(74) *Attorney, Agent, or Firm* — Bacon & Thomas, PLLC

(57) ABSTRACT

A light-emitting device package is disclosed and comprises at least one light-emitting device and a carrier. The light-emitting device includes a light-emitting diode chip attached to a first surface of a transparent substrate, wherein the chip comprises a first type conductivity semiconductor layer, an active layer and a second type conductivity semiconductor layer. The carrier comprises a p electrode, an n electrode, a platform and a reflective inside wall. The transparent substrate of the light-emitting device is attached to the platform by an adhering layer. In addition, an angle between the first surface of the transparent substrate and the platform is not equal to zero degree, and the better is about 90 degree.

19 Claims, 6 Drawing Sheets

LIGHT-EMITING DEVICE PACKAGE

BACKGROUND

1. Technical Field

A light-emitting device package is disclosed.

2. Reference to Related Application

This application claims the right of priority based on TW application Ser. No. 096143129, filed Nov. 13, 2007, entitled "LIGHT-EMITTING DEVICE PACKAGE", and the contents of which are incorporated herein by reference.

3. Description of the Related Art

Generally, light-emitting diodes (LEDs) having transparent substrates are divided into face-up type and flip-chip type. For the face-up type, the light-emitting diodes are attached to carriers by gels or metals; for flip-chip type, the light-emitting diodes are attached to carriers by metals or solders with the attached surface as the light extraction surface of the light-emitting diode or the surface parallel to it. Because the light extracted from the light-emitting layer of the light-emitting diodes are 360 degree, the light emitting downward is generally reflected to the front of the light extraction side by the reflecting layers or extracted from the transparent substrates. The thickness of the transparent substrate should be properly adjusted so that the brightness of the light extraction is acceptable. Besides, when the size of the light-emitting diodes is larger, there are more reflected light passing through the multi-quantum well (MQW) in the light-emitting layer. The light efficiency is reduced because of light absorption.

FIG. 1 shows a schematic illustration of conventional light-emitting device package. As shown in FIG. 1, a light-emitting diode chip 100 is attached to a carrier 3 with an attached surface 1 which is parallel to the front light extraction surface 4 of the light-emitting diode chip 100. The light emitted downward is reflected to the front light extraction surface 4 or the lateral light extraction surface 5 by the reflector 2. The disadvantage of this package is when the size of the light-emitting diode chip is larger, there are more reflected light passing through the multi-quantum well (MQW) in the light-emitting layer. The light efficiency is reduced because of light absorption.

SUMMARY

A light-emitting device package is disclosed. The light-emitting device package includes a light-emitting device and a carrier. The light-emitting device is attached to a transparent substrate and adhered to a carrier by an adhering material wherein the angle between the first surface of the transparent substrate and the carrier is not equal to zero degree. In an embodiment, the angle between the first surface of the transparent substrate and the carrier is 45-135 degree, and the better is about 90 degree.

A light-emitting device package is disclosed. A least one light-emitting device is a lateral set package with light easily extracted from the bottom of the light-emitting device. It can reduce the light absorption by the light-emitting layer and increase the light efficiency.

A light-emitting device package is disclosed. A least a light-emitting device fixed on a transparent substrate is adhered to a carrier by an adhering material wherein the angle between the first surface of the transparent substrate and the carrier is not equal to zero degree. In an embodiment, the angle between the first surface of the transparent substrate and the carrier is 45-135 degree, and the better is about 90 degree. In addition, diffusers are filled in the package. Because of the diffusers, the light is scattered and extracted from one side, and a lateral extraction light-emitting device package is form accordingly.

An application of the light-emitting device package is disclosed. A plurality of light-emitting device packages is attached to a carrier having a reflecting layer by the adhering material. The plurality of light-emitting device packages can further accompany with thin-film materials having different functions to form a backlight module of a liquid crystal display device.

An application of the light-emitting device package is disclosed. The light extracted from a plurality of lateral extraction light-emitting device packages are guided to a polarizer. The light emitted downward is reflected to the polarizer by a reflecting layer. All of the light emit through the thin-film material to form a backlight module of a liquid crystal display device.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1:
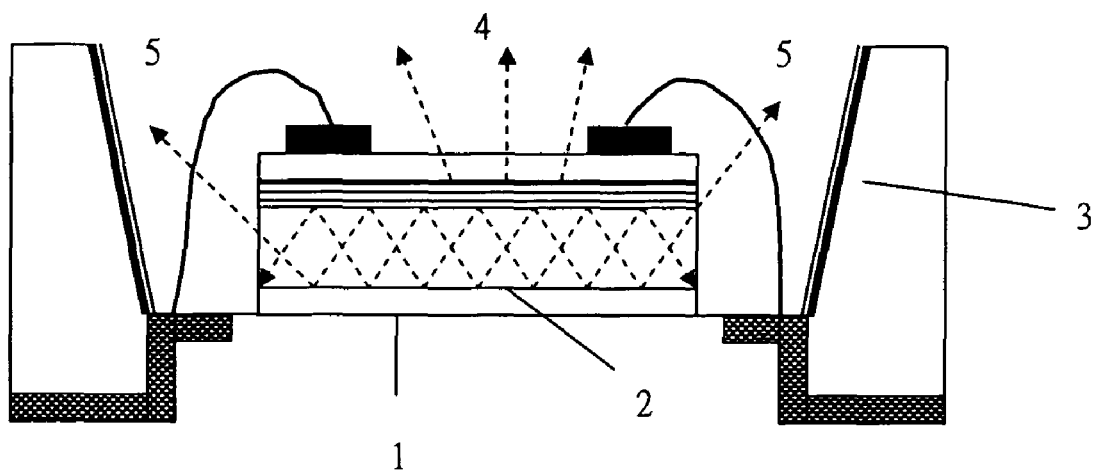
FIG. 1 is an illustration of conventional light-emitting device package.

Reference is made in detail to the preferred embodiments of the present invention, examples of which are illustrated in the accompanying drawings. Wherever possible, the same reference numbers are used in the drawings and the description to refer to the same or like parts.

Figure 2:
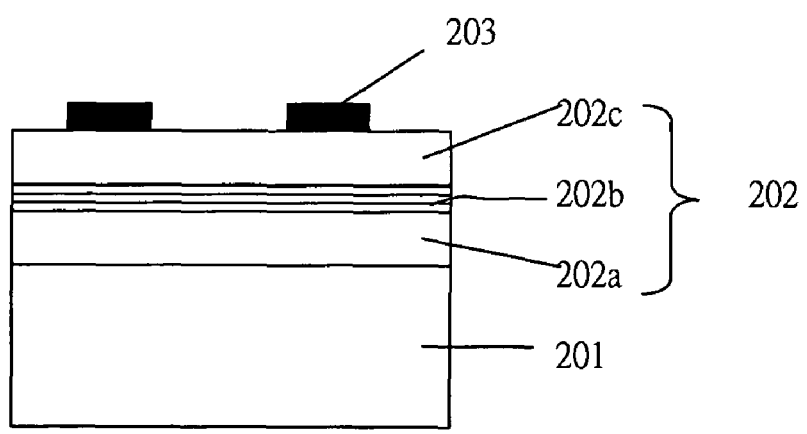
FIG. 2 is a lateral view of the light-emitting diode chip of the present invention.
Figure 3:
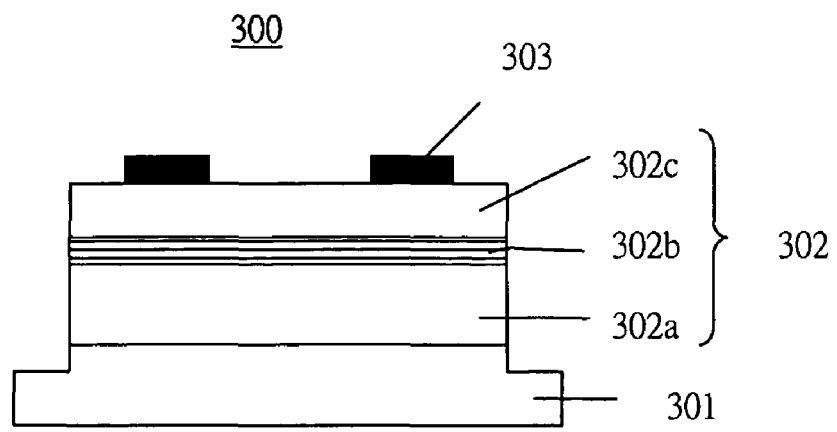
FIG. 3 is a lateral view of the light-emitting diode chip of another embodiment of the present invention.

FIGS. 2 and 3 show the light-emitting diode chips applicable to the embodiments of the present invention. Referring to FIG. 2, a structure of a light-emitting diode chip includes forming an epitaxial structure 202 on the growth substrate 201 by metal-organic chemical vapor deposition (MOCVD) process wherein the epitaxial structure having a least a first type conductivity semiconductor layer 202a, an active layer 202b and a second type conductivity semiconductor layer 202c. An electrode 203 is formed on the epitaxial structure 202 to form a light-emitting diode chip 200.

Referring to FIG. 3, a structure of a light-emitting diode chip includes an epitaxial structure 302 formed on the growth substrate 301 by metal-organic chemical vapor deposition (MOCVD) process wherein the epitaxial structure having a least a first type conductivity semiconductor layer 302a, an active layer 302b and a second type conductivity semiconductor layer 302c. A portion of the epitaxial structure 302 is etched from the top to the bottom to a portion of the growth substrate, and an electrode 303 is formed on the epitaxial structure 302 to form a light-emitting diode chip 300.

Figure 4:
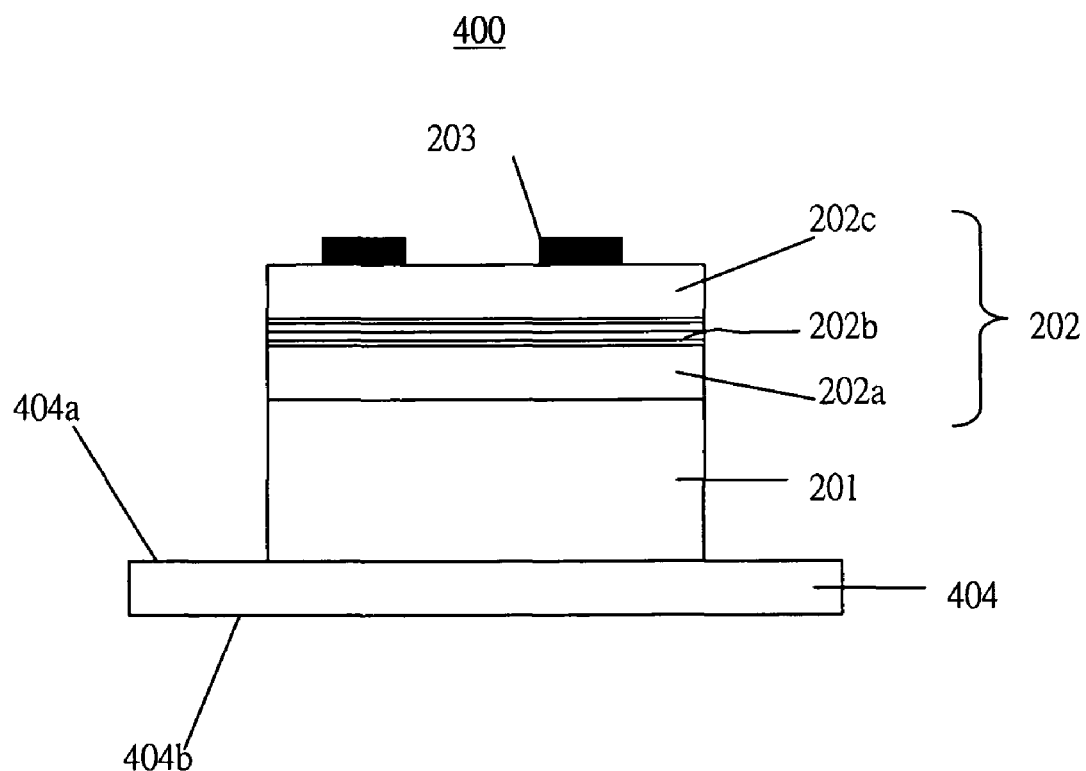
FIG. 4 is a lateral view of the light-emitting device of the present invention.

FIG. 4 is an illustration of the light-emitting device 400 applicable to the embodiments of the present invention. A light-emitting diode chip such as the light-emitting diode chip 200 or 300 is attached to a first surface 404a of the transparent substrate 404 to form a light-emitting device 400. The light-emitting diode chip 200, taken as an example, includes a growth substrate 201, an epitaxial structure 202 formed on the growth substrate 201 wherein the epitaxial structure having a least a first type conductivity semiconductor layer 202a, an active layer 202b and a second type conductivity semiconductor layer 202c, and an electrode 203 formed on the epitaxial structure 202.

Figure 5:
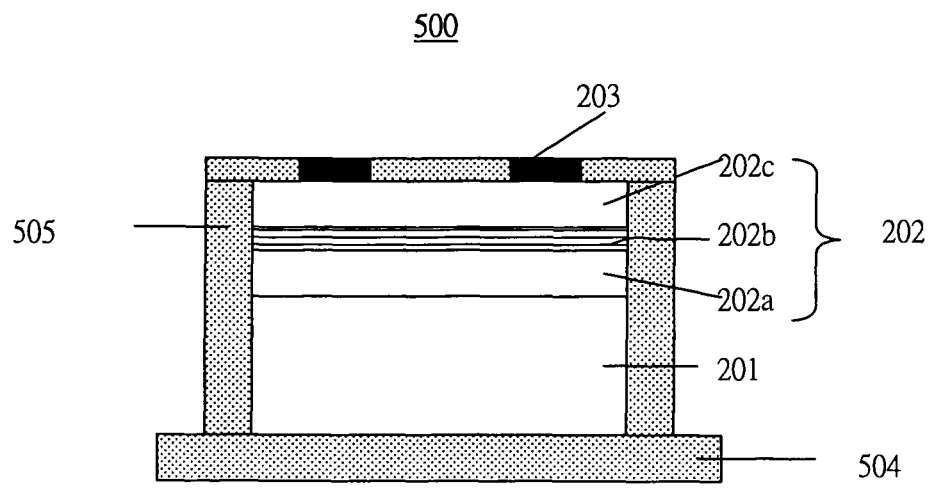
FIG. 5 is a lateral view of the light-emitting device of another embodiment of the present invention.

FIG. 5 is an illustration of the light-emitting device 500 applicable to the embodiments of the present invention. A light-emitting diode chip such as light-emitting diode chip 200, 300 or others having the same structure is attached to a transparent substrate 504 containing phosphors to form a light-emitting device 500. The light-emitting diode chip 200, taken as an example, includes a growth substrate 201, an epitaxial structure 202 formed on the growth substrate 201 wherein the epitaxial structure having a least a first type conductivity semiconductor layer 202a, an active layer 202b and a second type conductivity semiconductor layer 202c, and an electrode 203 formed on the epitaxial structure 202. Followed, a phosphor layer 505 is positioned over and around the light-emitting diode chip 200 to form a light-emitting device 500.

Figure 6:
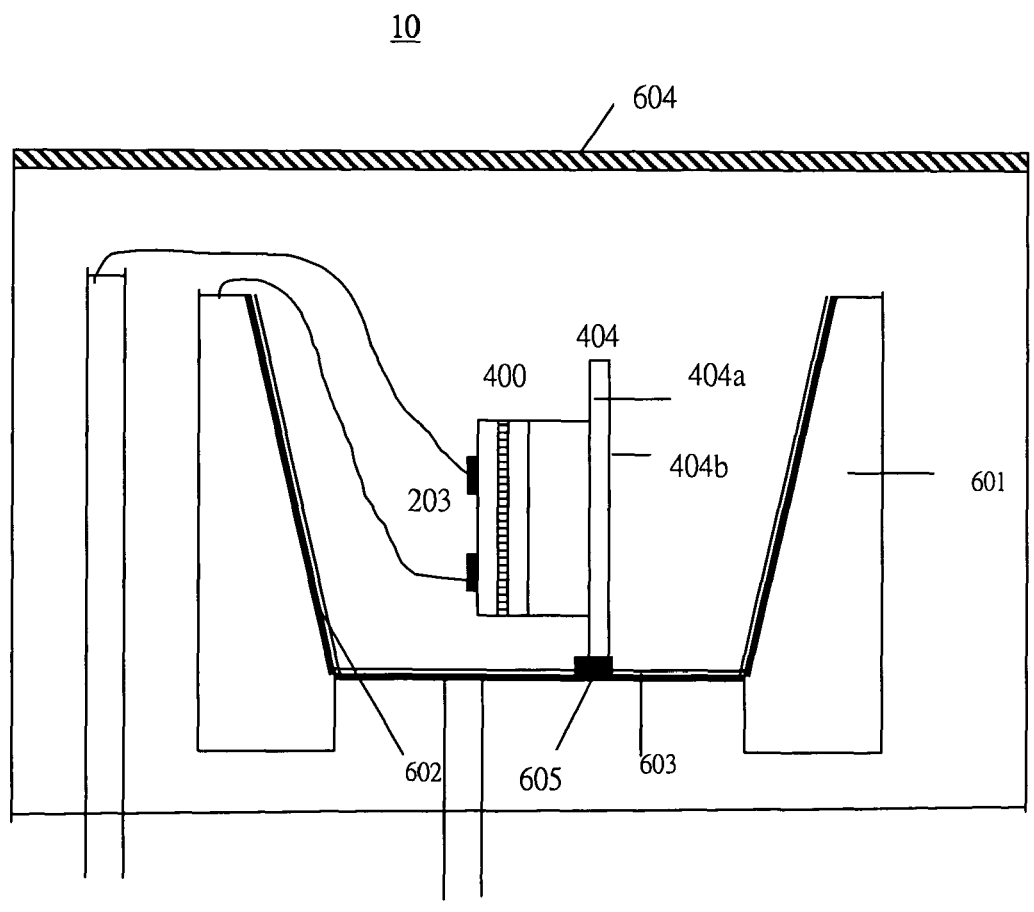
FIG. 6 is a lateral view of the light-emitting device package of the present invention.

FIG. 6 is a lateral view of the light-emitting device package of one embodiment of the present invention. The aforementioned structures of light-emitting device 400 or 500 are applicable to the package shown in the embodiments of the invention, and the light-emitting device 400 is chosen to describe the embodiments to avoid repeating description. Referring to FIG. 6, a carrier 601 having a reflective inside wall 602 is provided wherein the carrier can be a printed circuit board, a ceramics substrate, or a silicon substrate. A transparent substrate 404 of the light-emitting device 400 is attached to a platform 603 of the carrier 601 by an adhering material wherein the first surface 404a of the transparent substrate and its parallel surface (the second surface 404b) are disposed on the platform 603. In a preferred embodiment, the transparent substrate 404 is approximately perpendicular to the platform 603. In addition, the p and n electrode of the light-emitting device is electrically connected to a p electrode 606 and an n electrode 607 of the carrier respectively to form a light-emitting device package 10. The light emitted from the active layer of the light-emitting diode chip is omnidirectional. The light emitted to the first surface 404a of the transparent substrate is passed through the transparent substrate, and emitted from the second surface 404b of the transparent substrate. The light is reflected from the reflective inside wall 602 of the carrier and left the light-emitting device package 10. Besides, a lens 604 can be positioned over the light-emitting device package 10 to increase the light efficiency.

Figure 7:
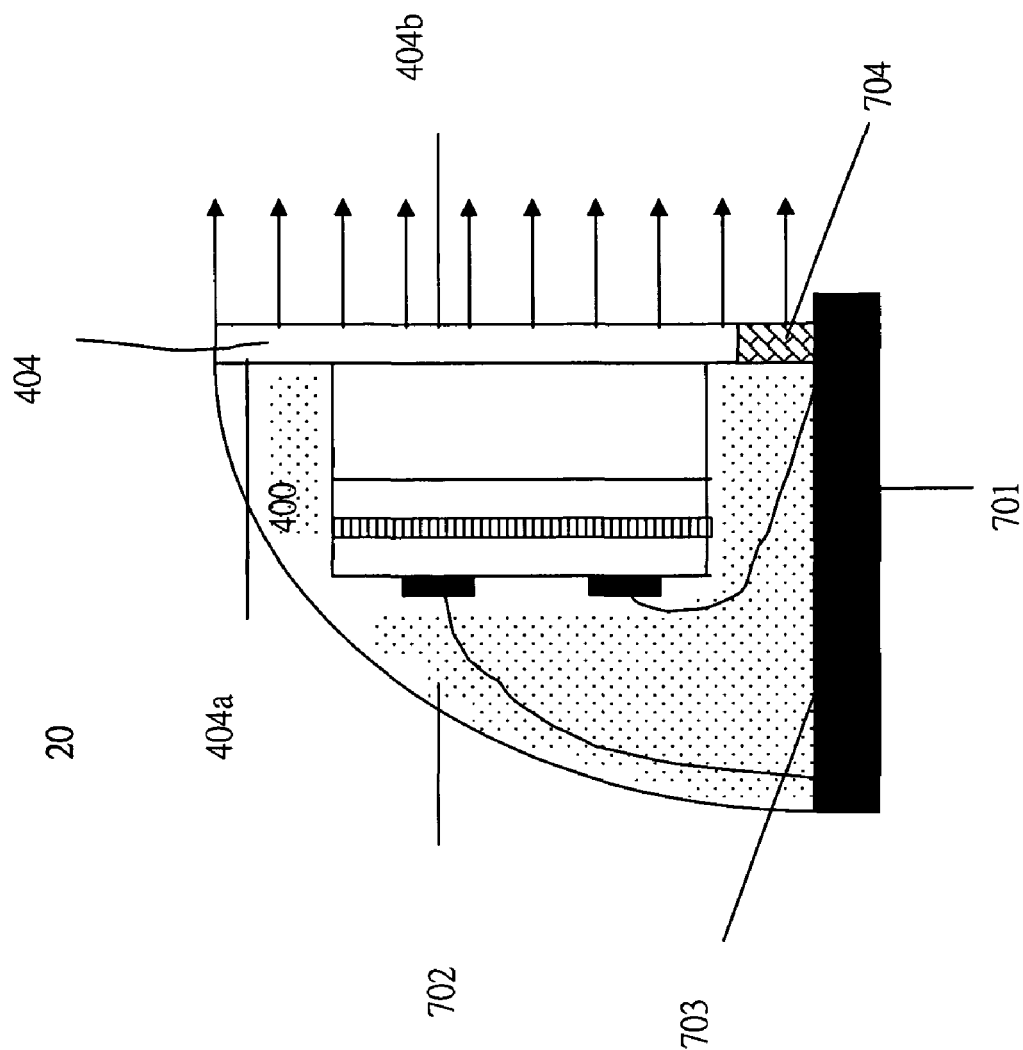
FIG. 7 is a lateral view of the light-emitting device package of another embodiment of the present invention.

FIG. 7 is a lateral view of the light-emitting device package of the second embodiment of the present invention. A transparent substrate 404 of a light-emitting device 400 is attached to a carrier 701 having a reflector 703 by an adhering material 704 wherein the carrier is a printed circuit board, a ceramics substrate, or a silicon substrate. In a preferred embodiment, the transparent substrate 404 is approximately perpendicular to the carrier 701. The p and n electrode of the light-emitting device is electrically connected to the p and n electrode of the carrier respectively. The diffusers 702 is filled in the light-emitting device package to scatter the light emitted from the light-emitting device. The light (as the arrows indicating in FIG. 7) passes through the transparent substrate 404 and is emitted out from the second surface 404b to form a lateral light-emitting device package 20.

Figure 8:
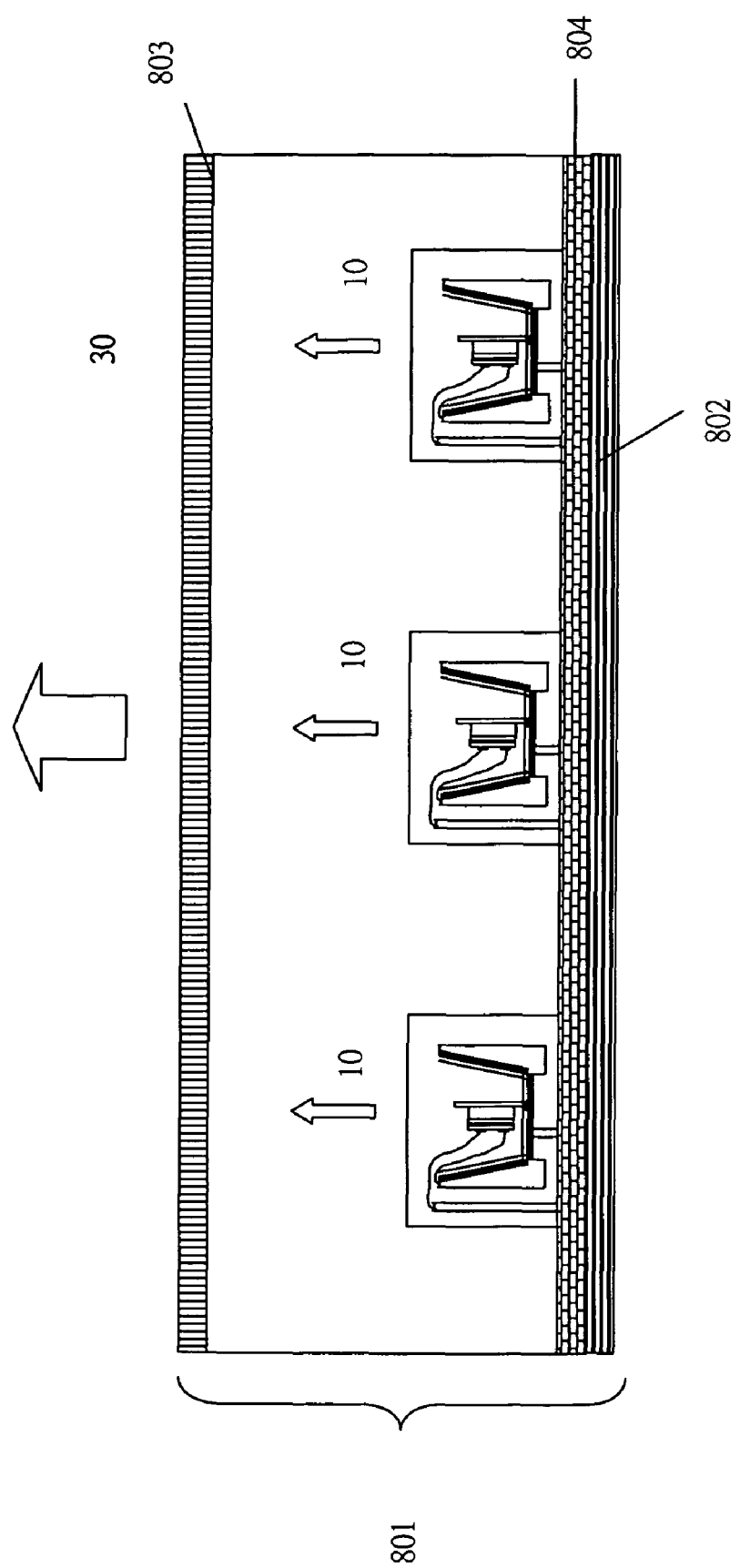
FIG. 8 is an illustration of the backlight module of the liquid crystal display device of the present invention.

FIG. 8 is a lateral-view of a backlight module 30 of the liquid crystal display devices accompanied with any one of the embodiments of the present invention. A plurality of light-emitting device packages 10 are attached to a carrier 801 having a reflecting layer 802 on the bottom by an adhering material 804 wherein the carrier is a printed circuit board, a ceramics substrate, or a silicon substrate. The p and n electrode of the light-emitting device is electrically connected to the p and n electrode of the carrier respectively wherein the structure of the light-emitting device package and the manufacturing method thereof is the same with illustration of FIG. 6 described above. The light emitted from the plurality light-emitting device packages pass through the thin-film material 803 with different functions, such as prism sheet, to uniformly emit the desired light, and a backlight module 30 of the liquid crystal display device is formed accordingly.

Figure 9:
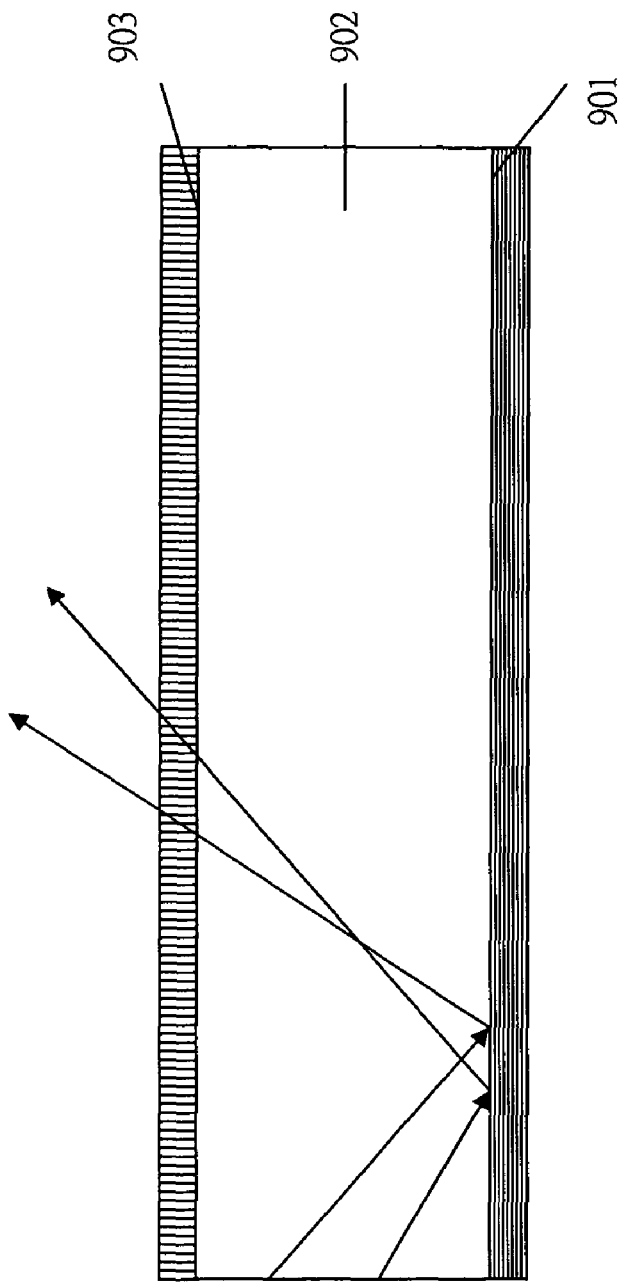
FIG. 9 is an illustration of another backlight module of the liquid crystal display device of the present invention.

FIG. 9 is an illustration of another backlight module 40 coupled with a polarizer of the liquid crystal display device as shown in FIG. 8. A polarizer 902 having a reflecting layer 901 on the bottom is covered with a thin-film material 903 on the top layer. The polarizer coupled with a plurality of lateral light-emitting device packages 20 to form a backlight module 40 of the liquid crystal display device. The lateral light emitted from the backlight module 40 is guided to the polarizer 902 (as the arrows indicating in FIG. 9) wherein the downward light is reflected from the reflecting layer 901 to the polarizer 902. The mixed and polarized light is emitted through the thin-film material 903 to the other structure of the liquid crystal display device, such as liquid crystal layer wherein the emitting direction of the light is as the arrows indicating in FIG. 9.

What is claimed is:

1. A light-emitting device package comprising:
   a carrier having a platform; and
   a light-emitting device comprising:
   a transparent substrate having a first surface and a second surface; and
   a light-emitting structure formed on the first surface of the transparent substrate, wherein the light-emitting structure comprises at least a growth substrate and an active layer with p-n junction formed on the growth substrate, and an angle between the first surface of the transparent substrate and the platform is 45-135 degree.

2. The light-emitting device package according to claim 1, wherein the carrier is electrically connecting to the light-emitting device.

3. The light-emitting device package according to claim 1, wherein the area of the first surface and/or the second surface is not smaller than the area of the p-n junction.

4. The light-emitting device package according to claim 1, wherein the angle between the first surface of the transparent substrate and the platform is about 90 degree.

5. The light-emitting device package according to claim 1, further comprising an adhering material for adhering the transparent substrate to the platform.

6. The light-emitting device package according to claim 1, further comprising a lens positioned over the carrier.

7. The light-emitting device package according to claim 1, wherein the carrier further comprises a reflecting layer formed on the inner surface of the carrier.

8. The light-emitting device package according to claim 1, wherein the transparent substrate further comprises phosphors.

9. The light-emitting device package according to claim 1, further comprising a phosphor layer coated around the light-emitting device.

10. The light-emitting device package according to claim 1, further comprising diffusers filled in the package.

11. The light-emitting device package according to claim 1, wherein the carrier is a printed circuit board, a ceramics substrate, or a silicon substrate.

12. A backlight module for liquid crystal display device comprising:
a carrier having a reflecting layer;
a light-emitting device package according to claim 1 attached on the reflecting layer of the carrier; and
a thin-film material formed on the carrier.

13. A backlight module for liquid crystal display device comprising:
a polarizer having a reflecting layer;
a light-emitting device package according to claim 1 disposed on the polarizer; and
a thin-film material formed on the polarizer.

14. A light-emitting device package comprising:
a carrier having a platform and a reflecting layer formed on the platform;
a plurality of transparent substrates having a first surface and a second surface respectively; and
a plurality of light-emitting devices having a plurality of light-emitting structures attached to the first surface of the plurality of transparent substrates respectively; and
an adhering material, wherein the plurality of transparent substrates is attached to the reflecting layer by the adhering material and the angle between the first surface of the transparent substrate and the platform is not equal to zero degree.

15. A backlight module for liquid crystal display device comprising:
a carrier having a reflecting layer;
a light-emitting device package according to claim 14 attached on the reflecting layer of the carrier; and
a thin-film material formed on the carrier.

16. A backlight module for liquid crystal display device comprising:
a polarizer having a reflecting layer on one surface;
a light-emitting device package according to claim 14 disposed on the polarizer; and
a thin-film material formed on the polarizer.

17. A light-emitting device package comprising:
a carrier having a platform; and
a light-emitting device comprising:
a transparent substrate having a first surface and a second surface; and
a light-emitting structure formed on the first surface of the transparent substrate, wherein the light-emitting structure has at least a growth substrate and an active layer with p-n junction formed on the growth substrate, and an angle between the p-n junction and the platform is not equal to zero degree.

18. A backlight module for liquid crystal display device comprising:
a carrier having a reflecting layer;
a light-emitting device package according to claim 17 attached on the reflecting layer of the carrier; and
a thin-film material formed on the carrier.

19. A backlight module for liquid crystal display device comprising:
a polarizer having a reflecting layer;
a light-emitting device package according to claim 17 disposed on the polarizer; and
a thin-film material formed on the polarizer.

* * * * *